United States Patent [19]
Johnson

[11] Patent Number: 5,113,372
[45] Date of Patent: May 12, 1992

[54] ACTIVELY CONTROLLED TRANSIENT REDUCING CURRENT SUPPLY AND REGULATION CIRCUITS FOR RANDOM ACCESS MEMORY INTEGRATED CIRCUITS

[75] Inventor: Gary M. Johnson, Boise, Id.

[73] Assignee: Micron Technology, Inc., Boise, Id.

[21] Appl. No.: 533,887

[22] Filed: Jun. 6, 1990

[51] Int. Cl.$^5$ ............................................. G11C 13/00
[52] U.S. Cl. ................................. 365/205; 365/226; 365/189.06
[58] Field of Search ............... 365/205, 226, 227, 154, 365/189.01, 189.06

[56] References Cited

U.S. PATENT DOCUMENTS 4,291,392 9/1981 Proebsting .......................... 365/203
4,980,863 12/1990 Ogihara ............................... 365/205

Primary Examiner—Terrell W. Fears
Attorney, Agent, or Firm—Wells, St. John & Roberts, P.S.

[57] ABSTRACT

Disclosed are current control circuits for use in random access memory integrated circuits, particularly dynamic random access memories (DRAM). The circuits are used to control the amount of current demanded from a electrical supply line from a portion of a memory array served by a sense amplifier, typically the pull-up sense amplifier. The circuits are effective at reducing the transient voltage drop associated with high current demand conditions when the sense amplifiers call for current to charge the bits during a read or refresh cycle. The circuits utilize a capacitor which stores energy while the sense amplifier is not demanding current. The capacitor is charged in a controlled manner to minimize voltage effects on the supply line. The charged capacitor is discharged through an actively controlled current control device, such as a transistor, to the sense amplifier. The charging current to the capacitor can be limited using a controlled transistor or other suitable gating device which is advantageously out of phase with the current control transistor feeding the sense amplifier. The circuits can also be provided with a second capacitor connected to the supply line and discharged to the sense amplifier through a second current control device. The second current control device preferably is of higher impedance to cause greater current demand on the first capacitor than on the supply line. The circuits provide improved transient reduction while maintaining acceptable operating speeds, or increased speed for a given transient voltage change.

25 Claims, 2 Drawing Sheets

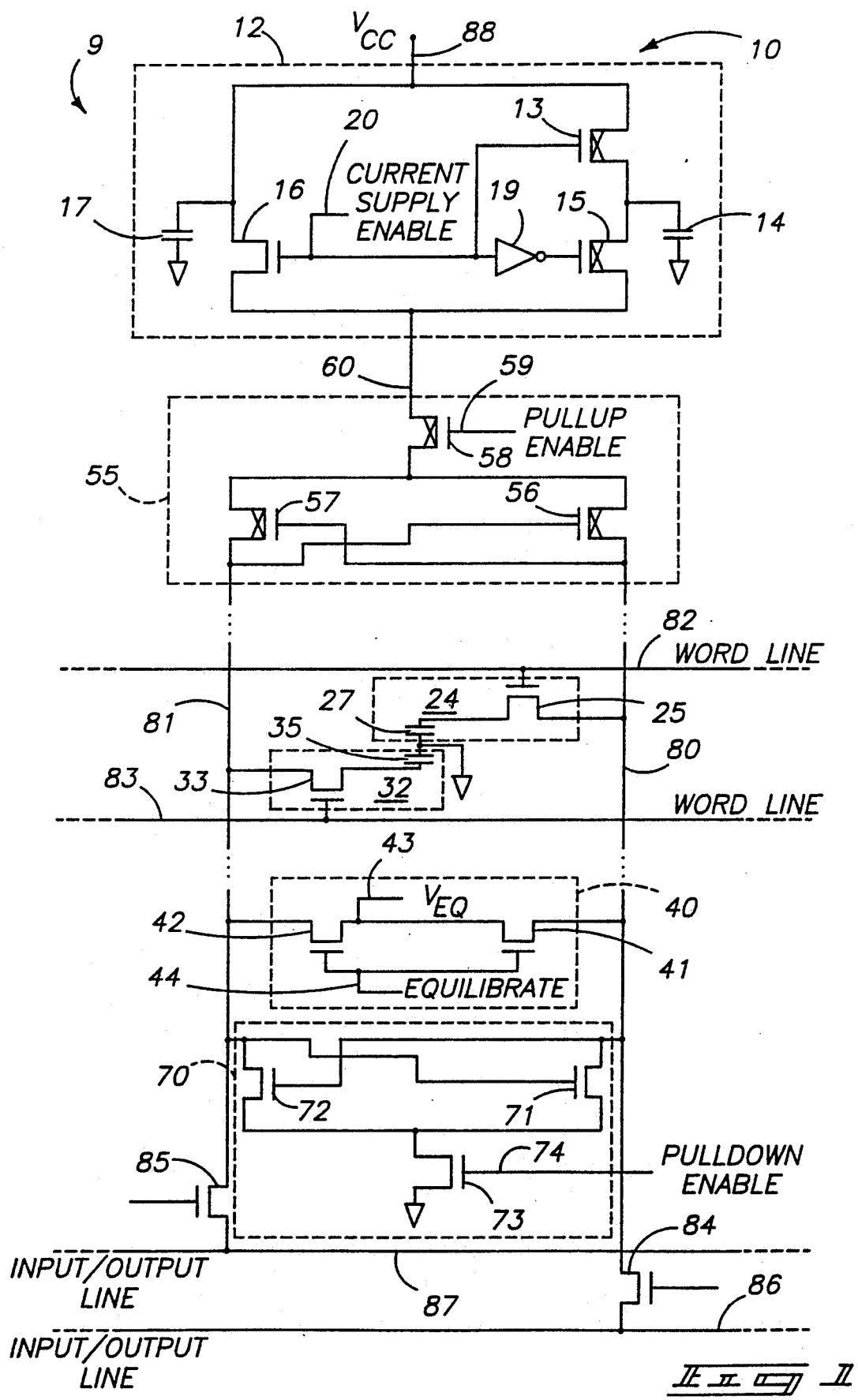

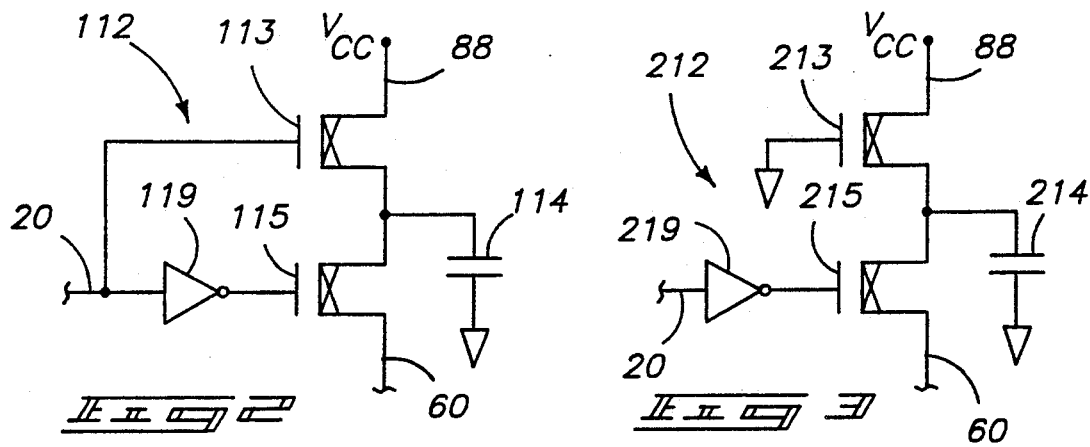
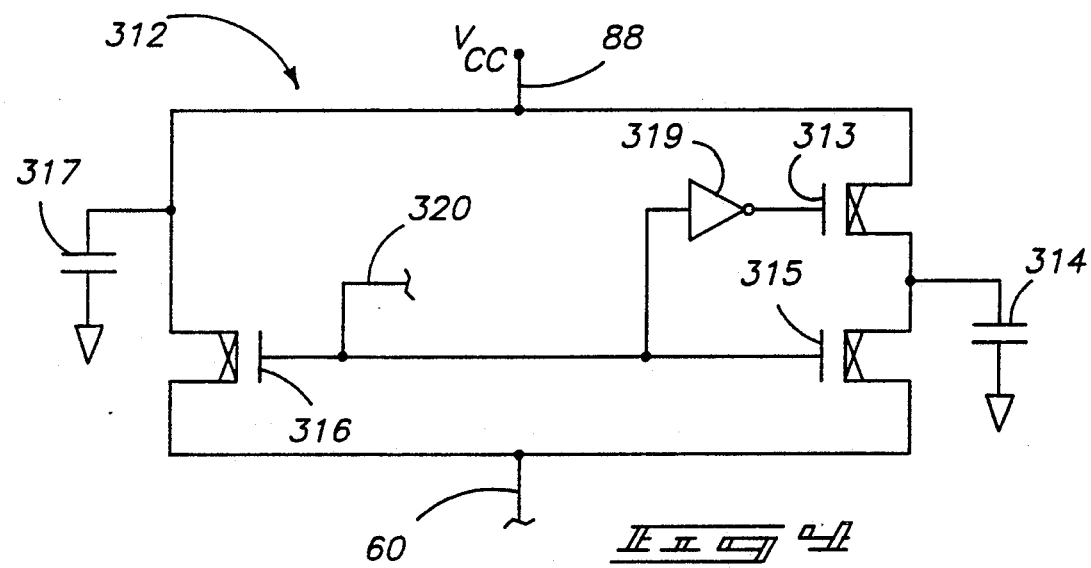
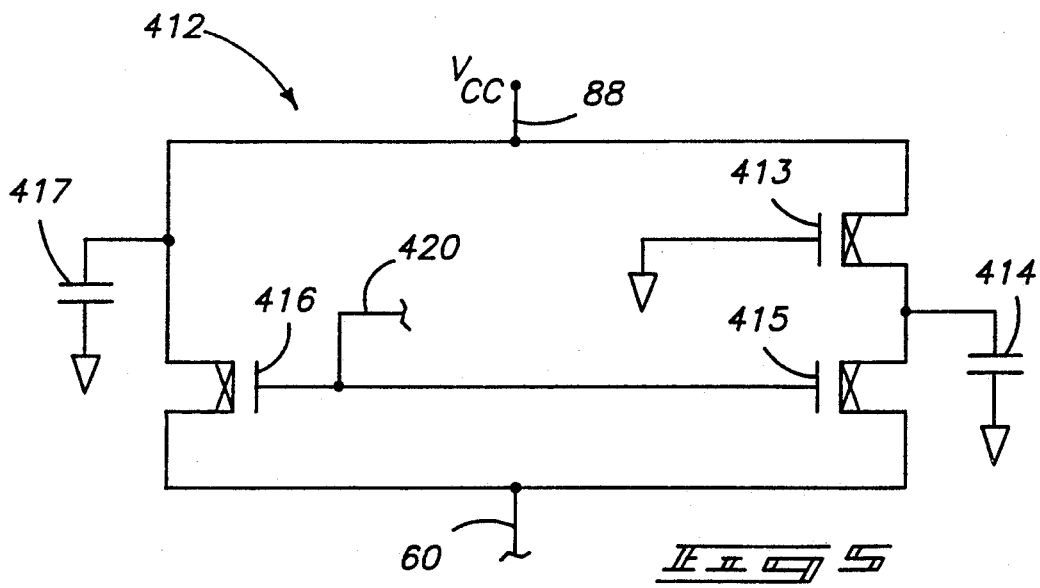

5,113,372

ACTIVELY CONTROLLED TRANSIENT REDUCING CURRENT SUPPLY AND REGULATION CIRCUITS FOR RANDOM ACCESS MEMORY INTEGRATED CIRCUITS

TECHNICAL FIELD

This invention relates to integrated circuit random access memories and the manner in which power is supplied to the memory cells. The invention is significant in reducing adverse effects which can occur from voltage changes caused by current switching, particularly when memory cells are being read or refreshed.

BACKGROUND OF THE INVENTION

Developments in the field of integrated circuits have lead to increasingly complex integrated circuit memories. Memory chips which are capable of storing millions of bits of digital information require increasingly small feature sizes. These very small sized electrical components have become increasingly taxed by requirements which test the limits of successful operation. A feature of importance to the current invention is the electrical supply line which delivers current to the various memory cells contained in a random access memory chip, particularly dynamic random access memory chips.

Each memory cell in an dynamic random access memory (DRAM) circuit utilizes a storage capacitor which is charged to a relatively low or high voltage to indicate either of two corresponding binary states. Because of leakage within the cell, the charge existing on the memory cell storage capacitor must be periodically refreshed to maintain the correct charge and associated binary state. The memory cell storage capacitor is refreshed to its high or low voltage condition either during the process of being read, or after a specific time interval in a refresh operation.

Refresh is performed by activating the particular memory cell in question. The cell is activated by appropriately indicating the cell from the numerous cells available on a memory array. In the case of a folded bit line type DRAM, this is done by effectuating a high condition on a word line and enabling the folded bit line which is connected to the cell. When the memory cell is activated, the storage capacitor is electrically connected to the bit line. If the charge on the storage capacitor is high, then the voltage of the connected bit line is increased when the capacitor discharges positive current onto the bit line. If the charge on the storage capacitor is low, then the voltage of the bit line is decreased when the capacitor takes positive current from the bit line.

Prior to connecting the memory cell storage capacitor to the bit line, the bit line is set to an intermediate voltage which allows the high or low charge in the memory cell to increase or decrease the voltage on the bit line. This intermediate voltage is advantageously achieved in the folded bit line configuration using two complementary bit lines which are oppositely charged when the cell is being written into or refreshed. This arrangement allows the complementary charges stored on the two complementary bit lines to equilibrate to an intermediate voltage by connecting them together and to an equilibrating voltage reference prior to the connection of the memory cell capacitor to its associated bit line.

The connection of the memory cell storage capacitor to the equilibrated bit line causes the voltage on the bit line to change either upwardly or downwardly in response to the relatively high or low state of the storage capacitor prior to connection with the bit line. The complementary bit line pair is connected to a positive electrical supply using a pull-up circuit which increases the voltage of the relatively more positive of the bit lines in the pair. Conversely, the bit line pair is also connected to ground or other relatively more negative electrical supply using a pull-down circuit which decreases the voltage of the other bit line. The pull-up circuit is advantageously in the form of a sense amplifier, such as a p-channel sense amplifier. The pull-down circuit is also advantageously in the form of a sense amplifier, such as an n-channel sense amplifier. The voltage produced on the bit line by the appropriate sense amplifier thus provides a refresh charge to the memory cell storage capacitor at the correct voltage level.

The pull-up circuit draws positive current from a relatively positive electrical supply line during the pull-up period while the storage capacitor is charging to its correct voltage. As the storage capacitor is charging to the high voltage, the pull-up circuit may demand a significant amount of current from the electrical supply line. In some cases the current demanded is sufficient to cause a voltage decrease transient on the supply line. This is a potential problem which may be exacerbated by numerous individual memory cells being simultaneously activated. While simultaneous access reduces the number of refresh cycles necessary in a given time, it also places increased current demands upon the supply line and, in practice, causes undesirable decreased voltage transients.

Prior DRAM circuits of this type have attempted to decrease this problem of voltage decrease transients by using a capacitor in conjunction with the pull-up circuit sense amplifier. This approach has not been sufficiently effective to eliminate the transient problem. Increasing the capacitance causes substantial decreases in speed which can not be accepted. Accordingly, there remains a need for more effective circuitry and methods for supplying power to pull-up circuits for folded bit line DRAM's and other random access memory chips having similar power transient problems.

BRIEF DESCRIPTION OF THE DRAWINGS

The preferred embodiments of the invention are illustrated in the accompanying drawings, in which:

FIG. 1 is an electrical schematic diagram of a portion of a dynamic random access memory integrated circuit. The diagram shows a pair of memory cells of an array, associated circuitry, and a preferred circuit according to this invention.

FIG. 2 is an electrical schematic diagram of portions of an alternative embodiment circuit of this invention.

FIG. 3 is an electrical schematic diagram of a second alternative circuit according to this invention.

FIG. 4 is an electrical schematic diagram of a third alternative circuit according to this invention.

FIG. 5 is an electrical schematic diagram of a fourth alternative circuit according to this invention.

DETAILED DESCRIPTION OF THE PREFERRED EMBODIMENTS

The following disclosure of the invention is submitted in furtherance of the constitutional purposes of the Patent Laws "to promote the progress of science and useful arts" (Article 1, Section 8).

FIG. 1 shows portions of a dynamic random access memory integrated circuit 9 according to this invention. The integrated circuit comprises a plurality of memory cells 24 and 32. The memory cells are conveniently arranged in memory array columns 10 each including numerous memory cell pairs, for example 512 or 1024. The memory cell pairs in each column are serviced by bit lines 80 and 81. The bit lines 80 and 81 are paired for operation by a pull-up circuit or positive sense amplifier 55, and by a pull-down or negative sense amplifier 70. Portions of one memory cell column 10 are shown in FIG. 1. First memory cell 24 and second memory cell 32 form a memory cell pair and are representative of the plurality of memory cells included within column 10. The description which follows will be directed to the characteristics and operation of a single column 10 and a single pair of memory cells 24 and 32. The same operation will apply to other memory cells within column 10 and to other columns within the array of memory cells included in memory integrated circuit 9.

First memory cell 24 comprises a storage capacitor 27 and an access switch 25 which is advantageously a field effect transistor, more preferably a metal oxide semiconductor field effect transistor. One side of memory cell storage capacitor 27 is connected to a suitable reference, such as ground, and the other side is connected to the drain of access transistor 25. Similarly, second memory cell 32 comprises a storage capacitor 35 and a field effect access transistor 33. One side of storage capacitor 35 is connected to ground and the other side is connected to the drain of access transistor 33. Memory cells 24 and 32 are structurally and operationally similar but controlled by different bit lines and word lines used to activate the cells.

Bit line 80 is connected to the source of access transistor 25, and bit line 81 is connected to the source of access transistor 33. First and second bit lines 80 and 81 are similarly connected to other memory cells (not shown) which form remaining parts of column 10. Bit line 80 is connected to a first digital signal input/output line 86 using a first column select switch 84. Column select switch 84 is preferably a metal oxide semiconductor field effect transistor controlled by a first column select signal connected to the gate of the transistor, which is specific to bit line 80. Column select switch 84 allows a binary signal to be supplied from line 86 to bit line 80 for storage in one or more memory cells. Column select switch 84 also controls the output of binary information from the numerous cells connected to bit line 80 onto line 86 for access by other circuits within the memory chip. Second column select switch 85 similarly connects second bit line 81 to a second digital signal input/output line 87. Second column select switch 85 is controlled by a second column select signal which is connected to the gate or other control terminal of switch 85.

The first and second memory cells 24 and 32 are controlled by independent activating signals carried on the first and second word lines 82 and 83, respectively. First word line 82 is connected to the gate or other control terminal of access transistor 25. Second word line 83 is connected to the gate or other control terminal of access transistor 33. Additional word lines (not shown) are similarly connected to other memory cells (not shown) within memory array column 10. Word lines 82 and 83 are also connected to other memory cells in other columns of the memory cell array which are not shown in the Figs.

Column 10 is serviced by a number of common circuits which perform specific operations for one or more cells in the column. These include the pull-up circuit 55 and the pull-down circuit 70. The pull-down circuit 70 is a low signal sense amplifier comprising a pair of n-channel field effect transistors 71 and 72. The drain of transistor 71 is connected to the gate of transistor 72 and to bit line 80. The drain of transistor 72 is connected to the gate of transistor 71 and to bit line 81. The source of transistor 71 and the source of transistor 72 are connected to each other and connected to ground through an n-channel field effect transistor 73. A pull-down enable line 74 is connected to the gate of pull-down enable transistor 73.

Pull-up circuit 55 is a high signal sense amplifier comprising a pair of p-channel field effect transistors 56 and 57. The drain of transistor 56 is connected to the gate of transistor 57 and to bit line 80. The drain of transistor 57 is connected to the gate of transistor 56 and to bit line 81. The source of transistor 56 and the source of transistor 57 are connected to each other and to the drain of a p-channel field effect transistor 58 which serves as a pull-up enable switch. A pull-up enable signal line 59 is connected to the gate or other control terminal of a pull-up enable switch transistor 58. A pull-up current supply line 60 is connected to the source of transistor 58. Current supplied to and demanded by the pull-up sense amplifier 55 is controlled by transistor 58.

Column 10 is also serviced by an equilibrating circuit 40. Equilibrating circuit 40 advantageously comprises a pair of field effect transistors 41 and 42. The drains of transistors 41 and 42 are connected to each other and to an equilibrating reference voltage line 43. The source of transistor 41 is connected to bit line 80. The source of transistor 42 is connected to bit line 81. The gates of transistors 41 and 42 are connected to an equilibrate enable signal line 44 which turns the transistors on to equilibrate the voltages on bit lines 80 and 81 to the desired intermediate reference voltage $V_{eq}$.

FIG. 1 also shows a preferred current supply circuit 12 according to this invention. Current supply circuit 12 regulates current demand from the $V_{cc}$ supply line 88 and supplies current demanded by the pull-up circuit 55 via pull-up current supply line 60. The current supply circuit 12 of FIG. 1 includes a charging control transistor 13 which actively controls current flow from the electrical source 88 to a regulation storage capacitor 14. Charging control transistor 13 has its source connected to voltage supply line 88 of the memory chip, and its drain connected to the storage capacitor 14. The gate or other control terminal of the charging control transistor 13 is connected to a suitable control signal, such as the current supply enable signal 20. The first regulation storage capacitor 14 has a first side connected to ground and a second side connected to the drain of charging transistor 13. A first current discharge control 15 is also connected to the second side of capacitor 14 to control the availability of charge stored in the energy storage capacitor 14 for use as current to power the pull-up circuit 55. The first current discharge control 15 advantageously comprises a p-channel field effect transistor which has its source connected to the drain of charging transistor 13 and to the second side of capacitor 14. The drain of the first discharge transistor 15 is connected to pull-up current supply line 60.

The first current discharge control transistor 15 is advantageously connected with the gate or other control terminal to a desired first current discharge control signal. As shown, the gate of transistor 15 is connected to the output of a signal inverter 19. The input of signal inverter 19 is connected to a current supply enable signal communicated via signal line 20.

FIG. 1 shows that current supply and regulation circuit 12 also advantageously includes a second current discharge transistor 16. Second current discharge transistor 16 is advantageously an n-channel field effect transistor with the source connected to electrical supply line 88 and its drain connected to pull-up current supply line 60. A second capacitor 17 has its first side connected to ground and its second side connected to the electrical supply 88 and the source of second discharge transistor 16. The current supply enable signal line 20 is connected to the gate of second discharge transistor 16 to control current flow therethrough to the pull-up circuit 55.

In operation, a high or low voltage charge, corresponding to a true or false (1 or 0) logic state, is placed on a storage capacitor within a memory cell during a write cycle. However, because of leakage, this charge will quickly dissipate unless it is periodically refreshed. In a dynamic random access memory such as shown and described, this refreshing operation must typically be performed on each memory cell at least once in every two milliseconds and is performed in a manner similar to a read cycle.

A typical read or refresh cycle, such as for memory cell 24, proceeds as follows. A high voltage is placed on the equilibrate enable signal line 43 to thereby turn on transistors 41 and 42. The equilibrating reference voltage $V_{eq}$ is thus applied to the bit lines 80 and 81. Charge also flows between the bit lines because they are routinely charged to complementary high and low levels by the operation of the sense amplifiers 55 and 70. The equilibrating reference voltage is at a voltage level approximately midway between the high and low voltages. A low voltage is then placed on the equilibrate enable line to turn off transistors 41 and 42, leaving bit lines 80 and 81 charged to approximately the equilibrating voltage.

Access transistor 25 is then activated, such as by applying a high voltage on word line 82 to turn on the access transistor. When transistor 25 is turned on the charge stored on storage capacitor 27 is applied to bit line 80. Bit line 80 has a higher capacitance than storage capacitor 27 thus diminishing the voltage change associated with discharge of the capacitor onto the bit line. If storage capacitor 27 had previously been charged to a relatively high voltage, then the voltage on bit line 80 will be increased but to a lesser degree. If storage capacitor 27 had previously been charged to a relatively low voltage, then the voltage on bit line 80 will be decreased. In either case bit line 80 will be charged to a voltage different from the complementary bit line 81.

After the stored charge on memory cell storage capacitor 27 is transferred to bit line 80, the pull-down circuit 70 is enabled. This is advantageously accomplished by applying a high voltage on pull-down enable line 74 to the gate of transistor 73, thus enabling the pull-down or negative sense amplifier 70 by connecting it to ground or other suitable negative reference voltage. The pull-down sense amplifier operates in response to one of bit lines 80 and 81 having a higher voltage than the other. The voltage on the higher voltage bit line is connected to the gate of either transistor 71 or 72 thus causing the transistor to turn on to a greater degree than the other transistor. This causes the gate of the other transistor to be pulled down to the ground voltage via the more conductive transistor thus turning the other transistor off. For example, if bit line 80 is high then transistor 72 turns on faster than transistor 71. Transistor 72 thus conducts the relatively more negative ground voltage to the gate of transistor 71 which is accordingly turned off. The ground voltage is also applied through the on transistor, such as transistor 72, to the bit line 81, thus charging the bit line and any activated memory cells to the low state. The memory cells are activated by turning the memory cell access transistors on using the appropriate word lines, such as word line 83 to charge capacitor 35 low via memory cell access transistor 33.

The pull-up or positive sense amplifier operates in a converse manner to the pull-down sense amplifier to charge the relatively higher voltage bit line to the desired high voltage state. This is advantageously done immediately after the pull-down circuit has begun pulling the low voltage bit line toward ground. The pull-up circuit 55 is activated by applying a low voltage to pull-up enable signal line 59 to thereby turn on n-channel transistor 58. Positive sense amplifier 55 operates in a manner converse to sense amplifier 70 to charge the higher voltage bit line to a higher voltage as supplied from electrical supply 88 via current supply regulator 12. This occurs in response to the application of the low voltage on the low voltage bit line to the gate of either transistors 57 or 58. For example, if bit line 81 is pulled low, then transistor 56 is turned on and the voltage in current supply line 60 is used to charge bit line 80 to a high voltage state. The high voltage on bit line 80 is communicated to the gate of transistor 57 to thereby turn it off. This maintains bit line 81 low and bit line 80 high.

After these operations, bit line 80 will be at a voltage level equal to the level originally written to memory cell 24 and the cell is refreshed. Column select transistor 84 can also be turned on to connect bit line 80 to the input/output line 86 to allow the state of selected memory cell 24 to be read from the memory array.

The charging operation of the pull-up sense amplifier 55 to the higher voltage bit line results in a relatively sudden and substantial current demand on the positive electrical supply 88. This higher voltage charging period defines a pull-up sense amplifier current demand period. Controlled current supply and regulation circuit 12 meets this current demand without transferring this sudden demand into a voltage decrease transient on supply line 88.

Current supply and regulation circuit 12 operates in the following manner. Prior to activation of the pull-up sense amplifier 55, a low voltage is applied to current supply enable line 20. This causes first and second discharge transistors 15 and 16 to both be turned off. However, charging control transistor 13 is turned on, thus allowing first capacitor 14 to charge to the voltage of the voltage supply line 88. Since second capacitor 17 is connected directly to the voltage supply line, it also will fully charge to the level of the voltage supply line 88. When the pull-up sense amplifier current demand period begins, a high voltage is applied to current supply enable line 18, turning off charging transistor 13 and turning on first and second discharge transistors 15 and 16. First and second capacitors 14 and 17 are thus discharged to the pull-up current supply line 60, to supply current demanded of sense amplifier 55. Upon completion of the pull-up charging of the higher voltage bit line, the pull-up enable transistor 58 and current supply enable signal are returned to their initial conditions to allow the capacitors 14 and 17 to recharge in expectation of the next pull-up operational cycle.

To regulate the current demanded from the supply line 88, the charging rate of capacitor 14 is advantageously limited. This is preferably accomplished by appropriately sizing the charging control transistor 13 to provide sufficient resistance so that the total current demand of the charging capacitors 14 and 17 is at an acceptable level while maintaining a sufficient charge rate to charge capacitor 14 to a voltage at or very near the supply line voltage $V_{cc}$ prior to operation of the pull-up circuit. The relative capacitance of capacitor 14 is also made greater than that of capacitor 17 to help regulate current demand from the supply line 88. More preferably, the capacitance of first capacitor 14 is approximately 2 or more times that of second capacitor 17. Even more preferably, the capacitance of first capacitor 14 is approximately 4 times that of second capacitor 17.

The current supply and regulation circuit 12 is also preferably constructed with the first current control transistor appropriately sized or otherwise constructed to have a lower impedance than second transistor 16 when both are turned on and discharging to the pull-up circuit 55. This limits and resists the flow of current directly from the supply line 88 via transistor 16 thus preventing unacceptable voltage decrease transients from being generated. The impedance of first current control transistor 15 is lower and thus facilitates the flow of current from the stored charge on the larger capacitor 14 to the pull-up circuit. Appropriate balance between the two capacitors and the impedance of the transistors 15 and 16 allows either or both improved operating speed or small voltage decrease transients on electrical supply line 88. In a preferred embodiment circuit as shown in FIG. 1, the on condition impedance of transistor 13 is approximately 5-20 times greater than transistor 15. The on condition impedance of transistor 16 is approximately 3-10 times greater than transistor 15.

FIG. 2 shows an alternative embodiment of current supply and regulation circuit 112 in accordance with this invention. Circuit 112 is labelled with reference numerals similar to those described above in connection with circuit 12, with an additional "1" in the hundreds column. The circuit does not include a second capacitor or second current control transistor such as included in circuit 12. The capacitor 114 is sized to provide substantially all operating current demanded by the pull-up circuit 55.

FIG. 3 shows an alternative embodiment of current supply and regulation circuit 212 in accordance with this invention. Circuit 212 is labelled with reference numerals similar to those described above in connection with circuit 12, with an additional "2" in the hundreds column. The circuit does not include a second capacitor or second current control transistor such as included in circuit 12. The capacitor 214 is sized to provide approximately 80-95% of the operating current demanded by the pull-up circuit 55. The remaining current is supplied via transistor 213 which is connected with its gate to ground or other suitable reference voltage to supply current from supply 88 as capacitor 214 discharges to the pull-up circuit. The charging transistor 213 acts as a current limiting device during the charging of the capacitor 214 while the pull-up circuit is disabled.

FIG. 4 shows an alternative embodiment of current supply and regulation circuit 312 in accordance with this invention. Circuit 312 is labelled with reference numerals similar to those described above in connection with circuit 12, with an additional "3" in the hundreds column. Circuit 312 differs from circuit 12 in that the current supply enable signal 320 is of reverse polarity to signal 20, and is connected to directly drive the first current control transistor 315. The charging control transistor 313 is activated via an inverter 319. The second current control transistor 316 is a p-channel field effect transistor instead of an n-channel device as shown in FIG. 1. This allows proper conduction with the reversed polarity current enable signal 320.

FIG. 5 shows an alternative embodiment of current supply and regulation circuit 412 in accordance with this invention. Circuit 412 is labelled with reference numerals similar to those described above in connection with circuit 12, with an additional "4" in the hundreds column. Circuit 412 differs from circuit 12 in that the current supply enable signal 420 is of reverse polarity to signal 20, and is connected to directly drive the first current control transistor 415. The charging current limiting transistor 413 is connected with the gate or other control terminal to ground or other suitable reference voltage to provide a desired current demand from the supply line 88 during the charging of capacitor 414. Transistor 413 allows current from line 88 during discharge of capacitor 414 to the pull-up circuit as explained above in connection with FIG. 3. The total current supplied via first current control transistor 415 is preferably approximately 2 of more times the current supplied via second current transistor 416, even more preferably 4 or more times the current supplied via second current transistor 416.

The circuits of FIGS. 2-5 operate in connection with remaining portions of the memory chip in the same or similar manner as described hereinabove in connection with circuit 12. The relative proportions of current supplied by the first capacitor and any second capacitor vary as indicated above in the description of FIGS. 2-5. The specific design values will vary dependent upon the current demanded by the pull-up or other demanding sense amplifier circuit used in the memory chip.

The invention also includes novel operational methods for supplying current to a memory integrated circuit sense amplifier and regulating current demand from the associated electrical supply which supplies the sense amplifier. The methods include charging a first energy storage device with current from the electrical supply during a charging period other than during the current demand period associated with the sense amplifier. The stored energy is preferably reserved by maintaining the charge as controlled by a current control devices, for example transistors 15, 115, 215, 315 and 415.

The current demanded from the electrical supply is limited, such as by controlling a charging current control transistor, such as transistors 13, to pass an acceptable amount of current. Similar control and limitation of the demanded current occur by including transistors 113, 213, 313 and 413 in the respective circuits. The limiting can occur by actively controlling the charging current to a suitable value by turning on the charging transistors 13, 113 and 313 to a suitable current rate while the associated current storage capacitors are being charged at time other than the current demand period of the sense amplifier being powered. The actively controlled charging current transistors can be controlled to be off or nearly off during the current demand period of the sense amplifier. The limiting of current can also be effectuated by sizing or otherwise appropriately selecting the charging current transistors to pass limited amounts of current from the electrical supply to the sense amplifier during the sense amplifier current demand period. This is advantageously accomplished in the current control circuits of FIGS. 3 and 5 by providing impedance of the charging control transistors 213 and 413, respectively, which are of sufficient value to reduce current demand from the electrical supply to an acceptable level. Limiting of current demand is also accomplished by sizing any second current storage capacitor, such as capacitor 17, to only allow a part of the operating current needed by the sense amplifier to be demanded during the charging of any such secondary capacitor.

The novel methods of this invention further include controllably discharging current from at least one energy storage device to the sense amplifier being powered. This is advantageously accomplished by actively controlling energy discharge from the one or more energy storage devices charged during the period when the sense amplifier is disabled. The current supplied from the energy storage device to the sense amplifier is controlled to provide a sufficient rate of current to efficiently power the sense amplifier. The current demanded from the supply line is regulated by limiting any current demanded during the controlled discharge of the energy storage capacitors during the sense amplifier current demand period.

The novel methods of this invention can further include dividing the current demand from the electrical supply between a first relatively larger capacity capacitor and a second relatively lesser capacity capacitor. The current demanded by charging of the first and second capacitors can be regulated by limiting or regulating the current supplied to the larger capacitor or capacitors, such as by using the current limiting charge transistors 13, 113, 213, 313, and 413. The methods can further be defined to include controlling and simultaneously discharging the divided stored energy from a plurality of energy storage capacitors in parallel to provide high speed current delivery to the sense amplifier being powered.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method for controllably demanding current from an electrical supply and for controllably supplying current to a sense amplifier which operates a portion of a random access memory integrated circuit, said sense amplifier being operated to demand current during a sense amplifier current demand period which forms a limited part of an operational cycle period of the random access memory integrated circuit; comprising:

charging a first energy storage device with charging current from the electrical supply during a first energy storage charging period at times other than the sense amplifier current demand period;

controllably discharging current from the first energy storage device to the sense amplifier during at least portions of the sense amplifier current demand period; and, limiting current demanded from the electrical supply.

2. A method according to claim 1 wherein said limiting includes limiting charging current from the electrical supply to the first energy storage device during the first energy storage charging period.

3. A method according to claim 1 wherein said limiting includes actively controlling current from the electrical supply.

4. A method according to claim 1 wherein said limiting includes actively controlling current from the electrical supply to appproximately stop current from the electrical supply to the first energy storage device during the sense amplifier current demand period.

5. A method according to claim 1 further comprising limiting sense amplifier operating current from the first energy storage device to the sense amplifier during the sense amplifier current demand period.

6. A method according to claim 5 and further comprising approximately stopping the current from the first energy storage device to the sense amplifier during periods other than the sense amplifier current demand period.

7. A method according to claim 1 further comprising:

charging at least one second energy storage device from the electrical supply;

supplying current from the electrical supply to the sense amplifier during at least portions of the sense amplifier current demand period; and, discharging current from the second energy storage device to the electrical supply during at least portions of the sense amplifier current demand period.

8. A method according to claim 7 further comprising separately limiting current from the electrical supply to the sense amplifier and from the first energy storage device to the sense amplifier.

9. A method according to claim 8 wherein the limiting of the current from the electrical supply is significantly greater than the limiting of the current from the first energy storage device.

10. A method according to claim 8 and further comprising stopping the current from the electrical supply and the first energy storage device to the sense amplifier during periods other than the sense amplifier current demand period.

11. A method according to claim 8 and further comprising limiting the charging current from the electrical supply to the first energy storage device.

12. A current supply circuit for controlling current demanded from an electrical supply and for controllably supplying current to a sense amplifier which operates a portion of a random access memory integrated circuit, said sense amplifier being operated to demand current during a sense amplifier current demand period which forms a limited part of an operational cycle period of the random access memory integrated circuit; comprising:

at least one first energy storage device connected to receive charging current from the electrical supply, and to discharge sense amplifier operating current to the sense amplifier during at least portions of the sense amplifier current demand period;

at least one first current control device for controlling discharge of sense amplifier operating current from the at least one first energy storage device to the sense amplifier; and at least one current limiting device connected between the first energy storage device and the electrical supply to limit current demanded from the electrical supply.

13. A circuit according to claim 12 wherein said at least one current limiting device includes a switchable current gating device to actively control current from the electrical supply.

14. A circuit according to claim 13 wherein the switchable current gating device serving as a current limiting device is controlled to be on during periods other than the sense amplifier current demand period, and the at least one first current control device is controlled to be on during at least portions of said sense amplifier current demand period.

15. A circuit according to claim 12 further comprising:

at least one second energy storage device connected to be charged by current from the electrical supply and to discharge current to the sense amplifier during at least portions of the sense amplifier current demand period;

at least one second current control device for controlling current from the electrical supply and at least one second energy storage device to the sense amplifier.

16. A circuit according to claim 15 wherein said at least one current limiting device includes a switchable current gating device to actively control current from the electrical supply.

17. A circuit according to claim 16 wherein the switchable current gating device serving as a current limiting device is controlled to be on during periods other than the sense amplifier current demand period, and the at least one first current control device is controlled to be on during at least portions of said sense amplifier current demand period.

18. A circuit according to claim 15 wherein said at least one first current control device conveys more current to the sense amplifier than said at least one second current control device.

19. A random access memory integrated circuit, comprising:

an array of memory cells each having an access switch which controls current flow to and from a storage capacitor; said memory cells being arranged on rows and columns;

a plurality of electrically conductive word lines, the word lines being connected to a control terminal of the access switch of a plurality of memory cells in a row;

a plurality of electrically conductive bit lines which are controllably connected by the access switches of a plurality of memory cells to the storage capacitors of such memory cells;

a plurality of sense amplifiers each connected to at least one bit line to provide current thereto; said sense amplifiers being operated to demand current during a sense amplifier current demand period which forms a limited part of an operational cycle period of the random access memory integrated circuit;

an electrical supply for providing electrical current used by the sense amplifiers;

a plurality of current supply circuits for controlling current demanded from the electrical supply and for controllably supplying current to the sense amplifiers; said current supply circuits each including:

at least one first energy storage device connected to receive charging current from the electrical supply, and to discharge sense amplifier operating current to the sense amplifier during at least portions of the sense amplifier current demand period;

at least one first current control device for controlling discharge of sense amplifier operating current from the at least one first energy storage device to the sense amplifier; and at least one current limiting device connected between the first energy storage device and the electrical supply to limit current demanded from the electrical supply.

20. A circuit according to claim 19 wherein said at least one current limiting device includes a switchable current gating device to actively control current from the electrical supply.

21. A circuit according to claim 20 wherein the switchable current gating device serving as a current limiting device is controlled to be on during periods other than the sense amplifier current demand period, and the at least one first current control device is controlled to be on during at least portions of said sense amplifier current demand period.

22. A circuit according to claim 19 further comprising:

at least one second energy storage device connected to be charged by current from the electrical supply and to discharge current to the sense amplifier during at least portions of the sense amplifier current demand period;

at least one second current control device for controlling current from the electrical supply and at least one second energy storage device to the sense amplifier.

23. A circuit according to claim 22 wherein said at least one current limiting device includes a switchable current gating device to actively control current from the electrical supply.

24. A circuit according to claim 23 wherein the switchable current gating device serving as a current limiting device is controlled to be on during periods other than the sense amplifier current demand period, and the at least one first current control device is controlled to be on during at least portions of said sense amplifier current demand period.

25. A circuit according to claim 22 wherein said at least one first current control device conveys more current to the sense amplifier than said at least one second current control device.

* * * * *